(12) United States Patent
Wu et al.

(10) Patent No.: US 8,762,821 B2
(45) Date of Patent: Jun. 24, 2014

(54) METHOD OF CORRECTING ADJACENT ERRORS BY USING BCH-BASED ERROR CORRECTION CODING

(75) Inventors: Wei Wu, Portland, OR (US); Shih-Lien L. Lu, Portland, OR (US); Muhammad M. Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 126 days.

(21) Appl. No.: 13/435,152

(22) Filed: Mar. 30, 2012

(65) Prior Publication Data

US 2013/0262957 A1    Oct. 3, 2013

(51) Int. Cl.
*H03M 13/00* (2006.01)
*G11C 29/00* (2006.01)

(52) U.S. Cl.
USPC .......................................... 714/785; 714/769

(58) Field of Classification Search
None
See application file for complete search history.

(56) References Cited

U.S. PATENT DOCUMENTS

| | | | | |
|---|---|---|---|---|
| 3,745,526 A * | 7/1973 | Hong et al. | ................... | 714/777 |
| 3,868,632 A * | 2/1975 | Hong et al. | ................... | 714/755 |
| 6,003,144 A * | 12/1999 | Olarig et al. | ................... | 714/42 |
| 6,779,148 B2 * | 8/2004 | Tanaka | ................... | 714/753 |
| 7,257,170 B2 * | 8/2007 | Love et al. | ................... | 375/340 |
| 7,278,082 B2 * | 10/2007 | Kim et al. | ................... | 714/752 |
| 8,359,515 B2 * | 1/2013 | Gunnam | ................... | 714/752 |
| 8,516,339 B1 * | 8/2013 | Lesea et al. | ................... | 714/763 |
| 2007/0058757 A1 * | 3/2007 | Kusume | ................... | 375/340 |
| 2007/0283208 A1 * | 12/2007 | Dell et al. | ................... | 714/752 |
| 2007/0283223 A1 * | 12/2007 | Dell et al. | ................... | 714/768 |
| 2008/0250016 A1 * | 10/2008 | Farrar | ................... | 707/6 |
| 2011/0179337 A1 * | 7/2011 | Chen et al. | ................... | 714/763 |

* cited by examiner

*Primary Examiner* — Daniel McMahon
(74) *Attorney, Agent, or Firm* — Trop, Pruner & Hu, P.C.

(57) ABSTRACT

An apparatus is provided that comprises a processor. The processor comprises a cache to store data, a decoder, an error classification module, and an error correction module. The cache stores data, the data encoded as a codeword. The decoder reads the codeword from cache and calculates a syndrome of the codeword using an H-matrix. The error classification module determines an error type of the syndrome. The H-matrix is redesigned such that the columns form a geometrical sequence, and as a result not only t-bit random errors but also (t+1) bit adjacent errors can be corrected. The error correction module, triggered by the enhanced error classification module, takes one of two sets of inputs depending on error type (either random error or adjacent error) and produces corrected data from the syndrome when the syndrome comprises a detectable and correctable error.

20 Claims, 7 Drawing Sheets

METHOD OF CORRECTING ADJACENT ERRORS BY USING BCH-BASED ERROR CORRECTION CODING

FIELD OF THE INVENTION

The present disclosure relates generally to microprocessors and memory systems, and more particularly, a method of correcting adjacent errors by using bch-based error correction coding.

BACKGROUND

Computer systems execute instructions of various codes. This code involves the transfer of code and data within and between processors and memory devices. Often, the code can be compromised, suffering the introduction of one or more errors. A soft error is a signal or data which is wrong, but does not necessarily imply a breakage in the system hardware. After observing a soft error, there is no implication that the system is any less reliable than before.

An error occurrence in a computer's memory system that changes an instruction in a program or a data value. Soft errors are typically remedied by error correction routines and do not typically damage a system's hardware; the only damage is to the data that is being processed.

Soft errors can occur when the radioactive atoms in the chip's material decay. The decay may produce a particle that strikes a memory cell causing the cell to change its state. The soft error rate (SER) steadily increases as the process technology scales downward. A single event upset, such as a particle strike, may cause single-bit upset (SBU) or multiple-bit upset (MBU). As the process geometry shrinks, the same particle will have a larger footprint in terms of bits. Therefore, MBU in nearby cells become more and more frequent.

Soft errors may also occur when the data being processed is affected by a noise phenomenon, typically when the data is on a data bus. The system may try to interpret the noise as a data causing errors in addressing or processing program code. The erroneous data may also be saved to memory and cause problems at a later time. Soft errors can occur on transmission lines, in digital logic, analog circuits, magnetic storage, and elsewhere, but are most commonly known in semiconductor storage.

When detected, a soft error may be corrected by rewriting correct data in place of erroneous data. Reliable systems use error correction to correct soft errors. However, in many systems, it may be impossible to determine the correct data, or even to discover that an error is present at all.

Soft errors are a major challenge in the design of memories and logic circuitry in microprocessors particularly as a result of technology scaling and increased SER.

DETAILED DESCRIPTION

Embodiments of the present disclosure provide a systematic construction method such that the error coverage of a random error correcting codes (ECC) extends to larger numbers of adjacent errors, without the need for additional ECC check bits. More specifically, embodiments of the present disclosure reorder the columns in a parity-check matrix (a.k.a H-matrix), such that the syndromes for adjacent errors and random errors are mapped to mutually different values. With the errors isolated to different syndromes, each error combination can be exclusively identified and corrected.

A common type of ECC used to protect on-chip caches are BCH codes. BCH codes form a class of cyclic error-correcting codes constructed using finite fields. BCH codes were invented in 1959 by Hocquenghem, Bose and Ray-Chaudhuri where the name of these codes comprises the initials of the inventors.

The methods associated with the embodiments of the present disclosure can be applied to any BCH-based ECC code. Two examples of such BCH-based ECC code include: 1) An enhanced Single Error Correct, Double Error Detect (SEC-DED) for Double-Adjacent-Error Correcting (SEC-DAEC); and 2) An enhanced Double Error Correct, Triple Error Detect (DEC-TED) for Triple-Adjacent-Error Correcting (DEC-TAEC). The code and methods associated with the embodiments of the present disclosure can be combined with bit-interleaving to correct for larger MBU's. By improving the error coverage, the code relaxes the restriction on the number or amount of inter-leaving without requiring an additional check bit. The systematic method to find the H-matrix for a given error coverage and the design utilizing the properties of the new H-matrix to detect and correct adjacent errors offer advantages over previously known methods and designs.

Figure 1:
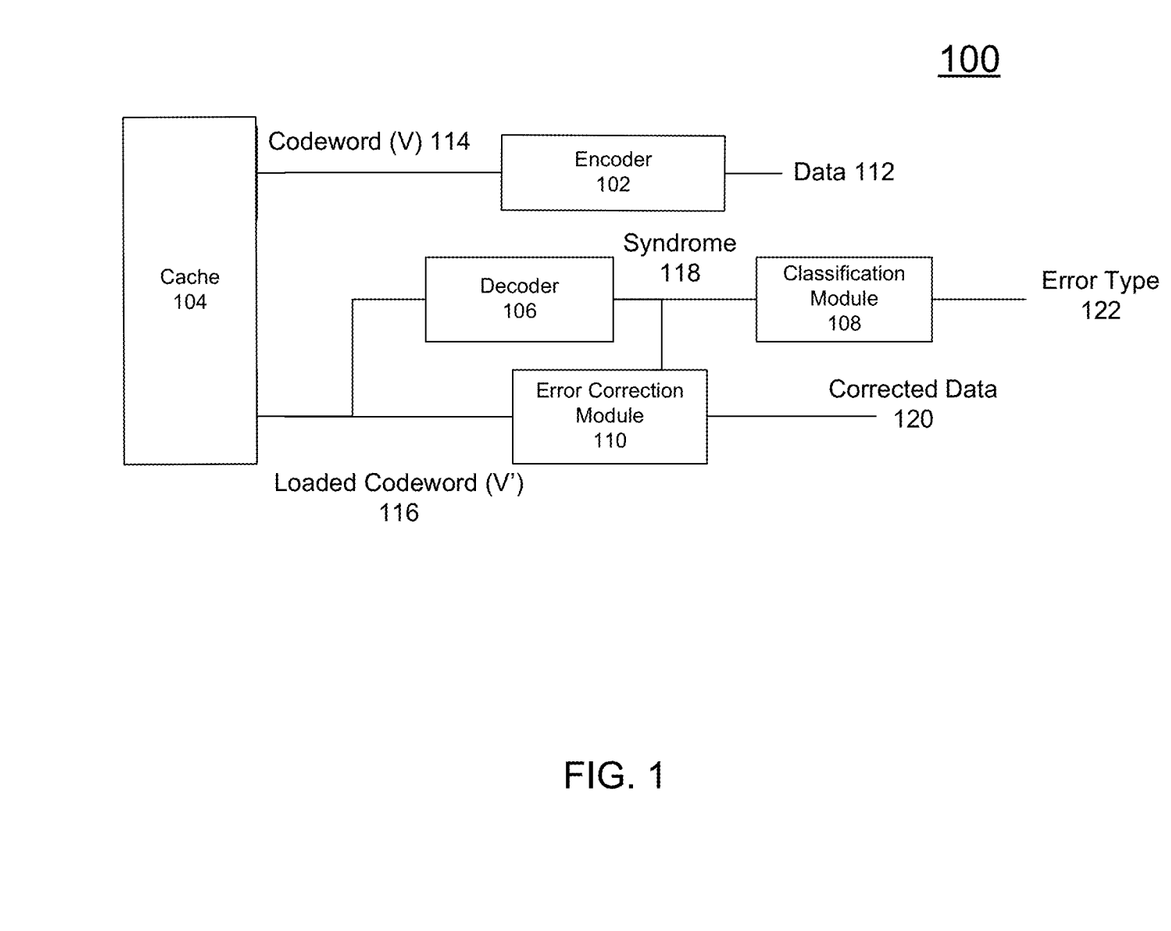
FIG. 1 is a block diagram for a cache array protected with ECC in accordance with an embodiment.

FIG. 1 is a block diagram for a cache array protected with ECC in accordance with an embodiment. Block diagram 100 includes an encoder 102, a cache 104, a decoder 106, a classification module 108 and an error-correction module 110. Data 112 is received and processed at encoder 102 to produce codeword 114. Codeword 114 is stored to cache 104. At a future point, codeword 114 may be retrieved from cache 104 and is provided as loaded codeword 116. Loaded codeword 116 is processed by decoder 106 to produce syndrome 118. Classification module 108 determines a need for further processing using error-correction module 110 and provided as corrected data 120. In the event of a favorable result by classification module 108, the decoded word may be provided as output data without the need for error correction. Should the decoder be unable to properly decode loaded code word 116, an error type 122 associated with this syndrome 118 can be provided as being uncorrectable.

FIG. 1 shows a cache array equipped with ECC protection. Each incoming data is processed by encoder 102 using generator matrix (G-Matrix) in an embodiment. The encoded data, also referred to as codeword (V) 116 is defined as V=D*G. Upon each read access, the codeword as loaded from cache 104, may or may not contain errors. The loaded codeword 116 is denoted as loaded codeword (V'), where V'=V+E, and E is the error. Decoder 106 calculates the syndrome (S) 118 by multiplying the loaded codeword V' with H-matrix, i.e. $S=V_t *H^T$ where $H^T$ is the transpose of H. The G-matrix and H-matrix are designed in such a way that $G*H^T=0$. Therefore, given any valid codeword, the syndrome must always be zero, because $S=V*H^T=D*G*H^T=0$.

Each ECC code is uniquely defined by its H-matrix. H-matrix, also called Parity-check matrix, determines the syndrome composition, error correcting and detection capability. Embodiments of the present disclosure provide a systematic method to reorder (reconfigure) the H-matrix such that certain adjacent errors can be exclusively corrected.

Equation (1) shows a standard H-matrix for a BCH-based tEC-(t+1)ED code (t-bit Error Correcting, (t+1)-bit Error Detection):

$$H = \begin{pmatrix} \text{Parity} \\ H_1 \\ H_3 \\ \dots \\ H_{2t-1} \end{pmatrix}$$

$$= \begin{bmatrix} 1 & 1 & 1 & 1 & \dots & 1 & 1 & \dots & 1 \\ 1 & \alpha & \alpha^2 & \alpha^3 & \dots & \alpha^i & \alpha^{i+1} & \dots & \alpha^{N-1} \\ 1 & \alpha^3 & (\alpha^2)^3 & (\alpha^3)^3 & \dots & (\alpha^i)^3 & (\alpha^{i+1})^3 & \dots & (\alpha^{N-1})^3 \\ \dots & \dots & \dots & \dots & \dots & \dots & \dots & \dots & \dots \\ 1 & \alpha^{2t-1} & (\alpha^2)^{2t-1} & (\alpha^3)^{2t-1} & \dots & (\alpha^i)^{2t-1} & (\alpha^{i+1})^{2t-1} & \dots & (\alpha^{N-1})^{2t-1} \end{bmatrix}$$

(1)

The H-matrix for BCH-based code has a modular structure. For SEC-DED, the H-matrix has only the first two rows [Parity, H1]$^T$, where H1 is used to correct any single error, and Parity determines whether total number of errors is odd or even, thus to detect all double errors. To correct more errors, more rows are added one by one. For example, the H-matrix for DEC-TED is [Parity, H1, H3]$^T$, and the H-matrix for 5EC-6ED would be [Parity, H1, H3, H5, H7, H9]$^T$. From Eq (1), each element in a high-order row is an exponentiation of the corresponding element in H1.

The order of columns in the H-matrix is not fixed. In the example of Eq (1), a standard form is shown where H1 has all elements sorted by exponent. However, the H-columns may be reordered. When a column is shuffled to new position, the entire column must be moved together, i.e. the vertical relation doesn't change. There are various H-matrix optimizations for different purposes. For example, to reduce the logic overhead, the columns with least number of 1's are selected. In some situations, columns are rearranged such that the rows having long adjacent 1's which can be reused as partial Parity.

A binary BCH-code is defined over a finite field, specifically a Galois Field GF($2^n$). Let N=$2^n$−1, and $\alpha$ be a primitive Nth root of unity, i.e. $\alpha^N$=1. The entire GF($2^n$) can be represented by $\alpha$ as $\{0, 1, \alpha, \alpha^2, \dots, \alpha^{N-3}, \alpha^{N-2}, \alpha^{N-1}\}$. The GF is multiplicative and cyclical. Since $\alpha^N$=1, given any integer x (x≥N), $\alpha^x$ equals to $\alpha^{x \mod N}$. Thus the field has limited number of elements.

The GF element can also be written as an n-bit binary vector. The entire GF($2^n$) is one-to-one mapped to a binary space (0 to $2^n$−1). Thus, binary arithmetic operations (+−*/) can be performed on GF elements. Additionally, for real circuit implementation the H-matrix in Eq (1) is represented in its binary form, with each element replaced by its binary vector.

The syndrome (S) for a valid codeword is always zero. Remembering that V'=V+E, then S=V'*H$^T$=(V+E)H$^T$=E*H$^T$. Therefore, the syndrome is essentially a signature of errors; more specifically S is the sum of columns that correspond to error bits. For example, if the errors are bits located at i, j, and k, then syndrome equals to H$_{COL\_i}$+H$_{COL\_j}$+H$_{COL\_k}$. Decoding diagnoses the error positions from the syndrome. For example if:

$$H = \begin{bmatrix} 1 & 1 & 0 & 1 & 1 & 0 & 0 \\ 1 & 0 & 1 & 1 & 0 & 1 & 0 \\ 0 & 1 & 1 & 1 & 0 & 0 & 1 \end{bmatrix}$$

and V'=V+[0 0 1 0 1 0 0], then syndrome $$S = V' * H^T$$

$$= [0\ 0\ 1\ 0\ 1\ 0\ 0] * \begin{bmatrix} 1 & 1 & 0 & 1 & 1 & 0 & 0 \\ 1 & 0 & 1 & 1 & 0 & 1 & 0 \\ 0 & 1 & 1 & 1 & 0 & 0 & 1 \end{bmatrix}^T$$

$$= \begin{bmatrix} 0 \\ 1 \\ 1 \end{bmatrix} + \begin{bmatrix} 1 \\ 0 \\ 0 \end{bmatrix}$$

$$= \begin{bmatrix} 1 \\ 1 \\ 1 \end{bmatrix}$$

The maximum number of columns in H-matrix is N, which is the total number of non-zero elements in GF($2^n$). In practice, the number of columns required equals to the number of bits in codeword. Extra columns are chopped. Such code is called shortened code. The selection of columns can be both arbitrary and for a particular purpose.

Given a tEC-(t+1)ED code, the H-matrix columns can be reordered by embodiments of the present disclosure such that the new matrix can correct (t+1) adjacent errors. The new code is named tEC-(t+1)AEC (Adjacent Error Correcting). Sort the columns, such that the H1 elements form a geometric sequence. The columns are sorted such that the H1 elements form a geometric sequence. Equation (2) shows an H-matrix H$_{adj}$ where m is the length of the codeword, m<N. The total number of columns is m. Let 'a' and 'b' be any integers, 'a' is relatively prime to N:

$$H = \begin{pmatrix} \text{Parity} \\ H_1 \\ H_3 \\ \dots \\ H_{2t-1} \end{pmatrix}$$

(2)

$$= \begin{bmatrix} 1 & 1 & 1 & \ldots & 1 & 1 & 1 \\ \alpha^b & \alpha^{a+b} & \alpha^{2a+b} & \ldots & \alpha^{ia+b} & \alpha^{(i+1)a+b} & \alpha^{(m-1)a+b} \\ (\alpha^b)^3 & (\alpha^{a+b})^3 & (\alpha^{2a+b})^3 & \ldots & (\alpha^{ia+b})^3 & (\alpha^{(i+1)a+b})^3 & (\alpha^{(m-1a+b)})^3 \\ & & & \ldots & & & \\ (\alpha^2)^{2t-1} & (\alpha^{a+b})^{2t-1} & (\alpha^{2a+b})^{2t-1} & \ldots & (\alpha^{ia+b})^{2t-1} & (\alpha^{(i+1)a+b})^{2t-1} & (\alpha^{(m-1)a+b})^{2t-1} \end{bmatrix}$$

In this geometric sequence (H1), $\alpha^a$ is the common ratio and $\alpha^b$ is the scale factor. For (t+1) adjacent errors starting from bit-i, the syndrome equals to the sum of H-columns from $i^{th}$ to $(i+t)^{th}$.

$$\text{Syndrome} = \begin{bmatrix} P \\ S_1 \\ S_3 \\ \vdots \\ S_{2t-1} \end{bmatrix}$$

$$= [0 \ \ldots \ 0 \ 1 \ 1 \ 1 \ \ldots \ 1 \ 0 \ \ldots \ 0] * H^T$$

$$= [H_{COL\_i} + H_{COL\_i+1} + \ldots + H_{COL\_i+t}]^T$$

$$= \begin{bmatrix} 1 & 1 & 1 & & 1 \\ \alpha^{ia+b} & \alpha^{(i+1)a+b} & \alpha^{(i+2)a+b} & & \alpha^{(i+t)a+b} \\ (\alpha^{ia+b})^3 & + (\alpha^{(i+1)a+b})^3 & + (\alpha^{(i+2)a+b})^3 & + \ldots + & (\alpha^{(i+t)a+b})^3 \\ (\alpha^{ia+b})^{2t-1} & (\alpha^{(i+1)a+b})^{2t-1} & (\alpha^{(i+2)a+b})^{2t-1} & & (\alpha^{(i+t)a+b})^{2t-1} \end{bmatrix}$$

$$= \begin{bmatrix} 1 \\ \alpha^{ia+b} \\ (\alpha^{ia+b})^3 \\ \vdots \\ (\alpha^{ia+b})^{2t-1} \end{bmatrix} * \begin{bmatrix} 1 & 1 & 1 & & 1 \\ 1 & \alpha^a & \alpha^{2a} & & \alpha^{ta} \\ 1 + & \alpha^{3a} & \alpha^{6a} & + \ldots + & \alpha^{3ta} \\ 1 & \alpha^{a(2t-1)} & \alpha^{2a(2t-1)} & & \alpha^{3ta(2t-1)} \end{bmatrix}$$

$$= H_{COL\_i}^T * \begin{bmatrix} 1 \\ k_1 \\ k_2 \\ \vdots \\ k_t \end{bmatrix}$$

The final syndrome is proportional to the column of the first error bit ($H_{COL\_i}$). The factor $K = [1, k_1, k_2, \ldots, k_t]$ is a constant.

$H_{adj}$ has the capability to correct t-bit random and (t+1)-bit adjacent errors. To do so, $H_{adj}$ has following three properties:
1) $H_{adj}$ is a valid BCH-based tEC-(t+1)ED code—Reordering the H-columns does not violate the code definition and no columns are repeated more than once. N and a must be co-prime to each other.
2) (t+1) adjacent errors can be detected—This requires the syndromes for (t+1) adjacent errors to be mutually different to syndrome for any random errors of up to t-bits. As in 1), $H_{adj}$ is a valid tEC-(t+1)ED code, and all the properties for tEC-(t+1)ED remain true. Therefore, (t+1)-adjacent errors as a subset of (t+1) random errors can be distinguished from random errors up to t-bit.
3) (t+1) adjacent errors can be corrected—This requires all (t+1)-adjacent errors have mutually different syndromes. The syndrome is a multiple of $H_{COLi}$. Since all columns are distinct, the syndromes for adjacent error must be distinct too.

The syndrome is calculated by decoder, and K is known given a defined code. The quotient of Syndrome/K is denoted as normalized Syndrome*. To detect an adjacent error, one checks whether Syndrome* matches the condition for a single-bit error. To correct an adjacent error, Syndrome* is applied to the correcting logic. When the first error bit is located, the rest are determined as well.

The values of a and b may be chosen where the combination reduces the total number of 1's in Hadj, such that the encoder and decoder has least number of XOR gates.

Figure 2:
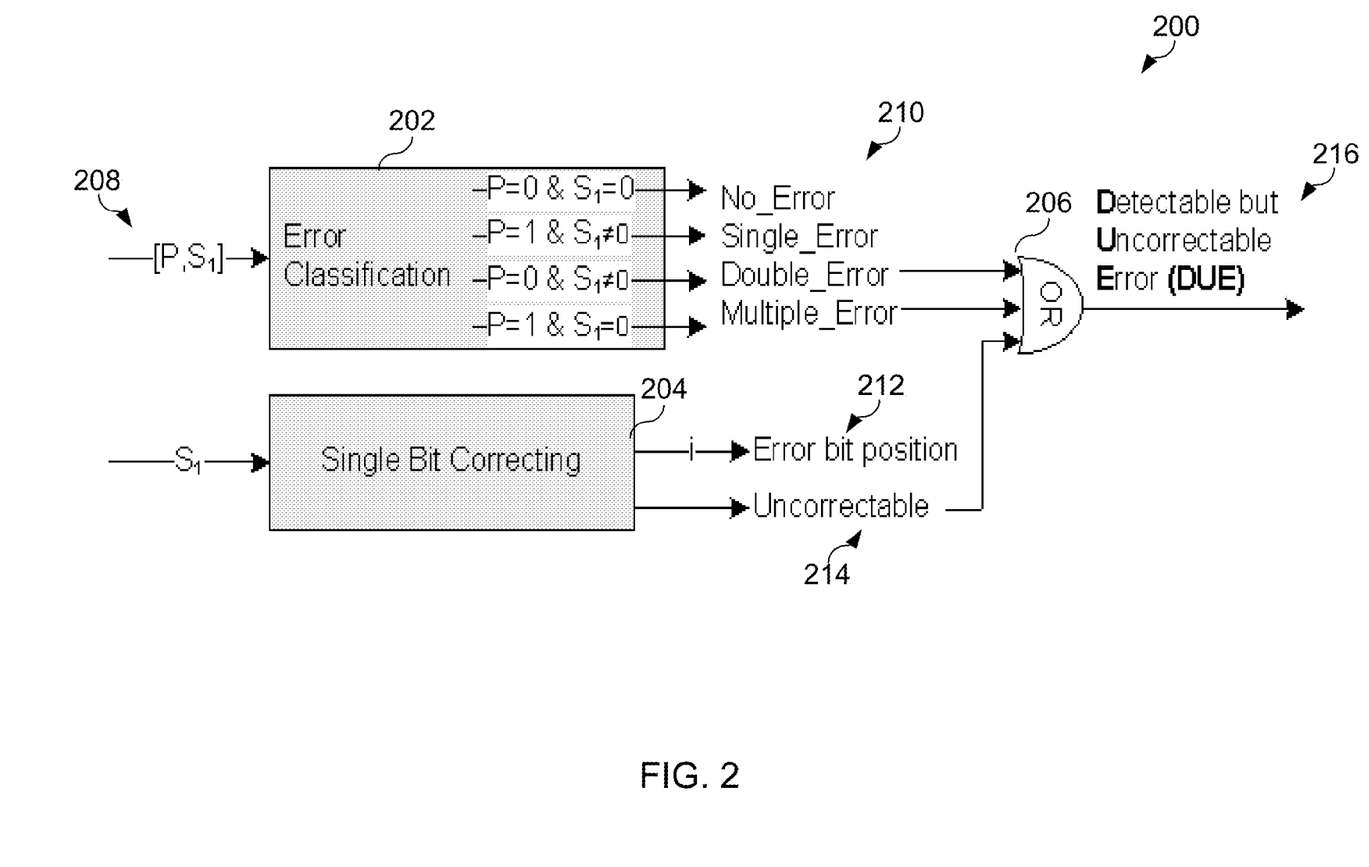
FIG. 2 is a block diagram associated with the error-correcting logic for SEC-DED in accordance with an embodiment.

FIG. 2 is a block diagram associated with the error-correcting logic for SEC-DED in accordance with an embodiment. Block diagram 200 includes a classification module 202, single bit correcting module 204, and logic circuitry 206 which in an embodiment may be an "OR" circuit. The classification module receives a syndrome 208 and parity information from a decoder processing module such as decoder 106 of FIG. 1. Single bit correcting module 204 also receives syndrome 208 from a decoder processing module such as decoder 106 of FIG. 1. Error classification module produces an error Type 210 by evaluating syndrome 208 and associated parity information. The possible error classification states may include: "No_Error," "Single_Error," "Double_Error," and "Multiple_Error" states. Error classification may pass an indication that the error type is an uncorrectable multiple error to logic circuitry 206. Single bit correcting module 204 provides single-bit correction to the syndrome where possible. Single bit correcting module 204 generates an error bit position flag 212 and an output indicating if the error in uncorrectable. Uncorrectable error flag 214 may pass an indication that the error type is an uncorrectable multiple error to logic circuitry 206. Logic circuitry 206 produces an output indicating the presence or lack of a detectable but uncorrectable Error (DUE) 216.

Error classification module 202 generates the error type by evaluating the syndrome bits. If the syndrome indicates this is a "Single_Error", then the "Single Bit Correcting" module 204 is triggered. Single bit correcting module 204 compares S1 to every single H-matrix column. The column that matches the syndrome indicates the error bit position. In rare situations, S1 may not match to any of the columns. This indicates an uncorrectable multiple error which happens to have odd number of error (parity=1). Warning signal (DUE) may or may not be raised for such case depending on the detailed implementation and system requirement.

For SEC-DED and SEC-DAEC, in one example a=1 and b=0, then H-matrix is the same as the standard definition:

$$Hmatrix = \begin{bmatrix} \text{Parity} \\ H_1 \end{bmatrix} = \begin{bmatrix} 1 & 1 & 1 & 1 & \ldots & 1 & \ldots & 1 \\ \alpha^0 & \alpha^1 & \alpha^2 & \alpha^3 & \ldots & \alpha^i & \ldots & \alpha^{m-1} \end{bmatrix}$$

The syndrome for double adjacent error is:

$$\text{Syndrome} = \begin{pmatrix} P \\ S_1 \end{pmatrix} = H_{COL\_i} * \begin{pmatrix} 0 \\ 1+\alpha \end{pmatrix}.$$

In another example, a=2 and b=5, then H-matrix is defined as:

$$Hmatrix = \begin{bmatrix} \text{Parity} \\ H_1 \end{bmatrix} = \begin{bmatrix} 1 & 1 & 1 & 1 & \ldots & 1 & \ldots & 1 \\ \alpha^5 & \alpha^7 & \alpha^9 & \alpha^{11} & \ldots & \alpha^{2i+5} & \ldots & \alpha^{2m+3} \end{bmatrix}$$

The syndrome for double adjacent error is:

$$\text{Syndrome} = \begin{pmatrix} P \\ S_1 \end{pmatrix} = H_{COL\_i} * \begin{pmatrix} 0 \\ 1+\alpha^2 \end{pmatrix}.$$

Figure 3:
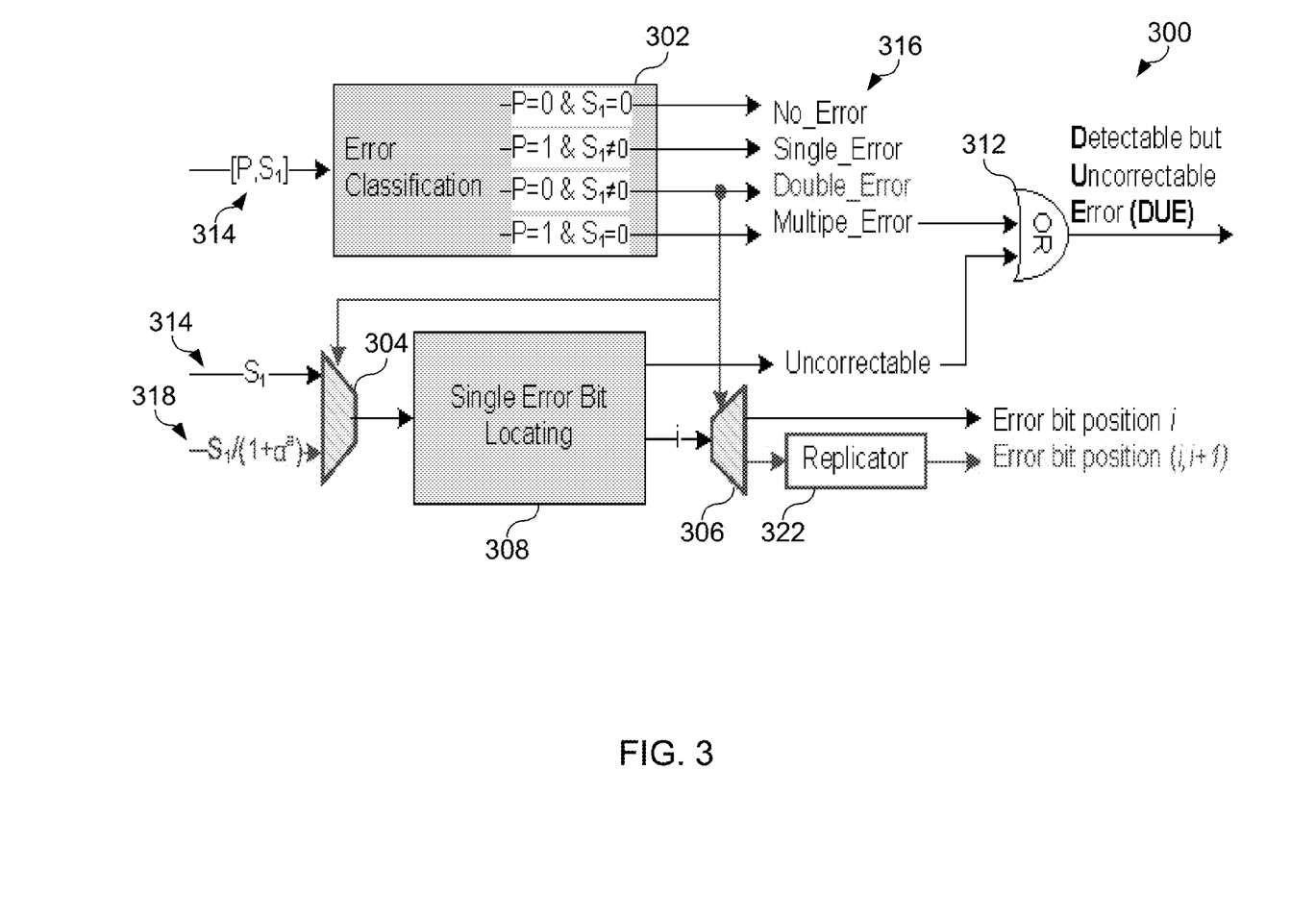
FIG. 3 is a block diagram associated with logic circuitry for SEC-DAEC in accordance with an embodiment.

FIG. 3 is a block diagram associated with logic circuitry for SEC-DAEC in accordance with an embodiment. Diagram 300 includes an error classification module 302, multiplexor 304 and multiplexor 306, single error bit locating module 308, replicator 310 and logic circuitry 312. Error classification module 302 receives syndrome 314 and parity information from a decoder processing module such as decoder 106 of FIG. 1. Bit correcting module 308 also receives syndrome 314 from a decoder processing module such as decoder 106 of FIG. 1 but in this case through multiplexor 304. Error classification module 302 produces an output 316 which describes the error associated with the syndrome. The possible error classification states may include: "No_Error," "Single_Error," "Double_Error," and "Multiple_Error" states. Error classification may pass an indication that the error type is a double error to bit correcting module 308 by triggering bit correcting module 308 to process a pair of adjacent errors through the activation of multiplexor 304 and multiplexor 306. Error classification may pass an indication that the error type is a multiple error to logic circuitry 312. Bit correcting module 308 provides single-bit correction to the syndrome where possible. Upon the determination of a double error this information is provided to the single error bit locating module 308 via multiplexor 306 and 304. This allows the logic to determine when double errors exist that can be corrected as adjacent errors. Single error bit locating module 308 provides an output to the logic circuitry 312 indicating that should a double error exist whether or not the double error is uncorrectable. A detectable or uncorrectable error flag is produced by the logic circuitry on presentation of input associated with multiple errors from error classification module 302 or uncorrectable errors from single error bit locating module 308. Single error bit locating module also produces an output 318 describing the error bit position and the error bit position of an adjacent error in the case of a double error.

FIG. 3 provides correcting logic for SEC-ADEC. Here both the "Double_Error" state and the "Single_Error" state will trigger correcting logic. For a single-bit error, the logic behaves the same as described in FIG. 2. In the case of a double (adjacent) error, the Syndrome*=S1/(1+$\alpha^a$) 318 is applied to the Single bit locating logic. This is the syndrome for the starting error bit. At output side, the Replicator 322 will mark the bit following the detected error, as the result is expected to be double and adjacent bits.

The 'Uncorrectable' signal not only indicates multiple-odd-bit errors, but also random double errors. However, not all of the random double errors can be distinguished. Some might be falsely corrected as adjacent errors, and contributes to the miscorrecting rate.

For DEC-TED and DEC-TAEC, in one example a=1 and b=0, then H-matrix is the same as the standard definition:

$$Hmatrix = \begin{bmatrix} \text{Parity} \\ H_1 \\ H_3 \end{bmatrix} = \begin{bmatrix} 1 & 1 & 1 & 1 & & 1 & & 1 \\ 1 & \alpha & \alpha^2 & \alpha^3 & \ldots & \alpha^i & \ldots & \alpha^m \\ 1 & \alpha^3 & \alpha^6 & \alpha^9 & & \alpha^{3i} & & \alpha^{3m} \end{bmatrix}$$

The syndrome for double adjacent error is:

$$\text{Syndrome} = \begin{pmatrix} P \\ S_1 \\ S_3 \end{pmatrix} = H_{COL\_i} * \begin{pmatrix} 1 \\ 1+\alpha+\alpha^2 \\ 1+\alpha^3+\alpha^6 \end{pmatrix}.$$

In another example, a=2 and b=5, then H-matrix is the same as the standard definition:

$$Hmatrix = \begin{bmatrix} \text{Parity} \\ H_1 \\ H_3 \end{bmatrix} = \begin{bmatrix} 1 & 1 & 1 & 1 & & 1 & & 1 \\ \alpha^5 & \alpha^7 & \alpha^9 & \alpha^{11} & \ldots & \alpha^{2i+5} & \ldots & \alpha^{2m+3} \\ \alpha^{15} & \alpha^{21} & \alpha^{27} & \alpha^{33} & & \alpha^{6i+15} & & \alpha^{3(2m+3)} \end{bmatrix}$$

The syndrome for double adjacent error is:

$$\text{Syndrome} = \begin{pmatrix} P \\ S_1 \\ S_3 \end{pmatrix} = H_{COL\_i} * \begin{pmatrix} 1 \\ 1+\alpha^2+\alpha^4 \\ 1+\alpha^6+\alpha^{12} \end{pmatrix}.$$

The scale factor is K=[1, $k_1$, $k_2$]$^T$ where $k_1$=1+$\alpha^2$+$\alpha^4$ and $k_2$=1+$\alpha^4$+$\alpha^{12}$. When a and b are defined, the values of $k_1$ and $k_2$ are determined too. The transformed syndrome is defines as: Syndrome*=(P, $S_1$*, $S_3$*)=(P, $S_1/k_1$, $S_3/k_2$). If V has a TAE error, then the Syndrome* must satisfy the condition of a single-bit error, i.e. P=1 and $(S_1^*)^3=S_3^*$.

Figure 4:
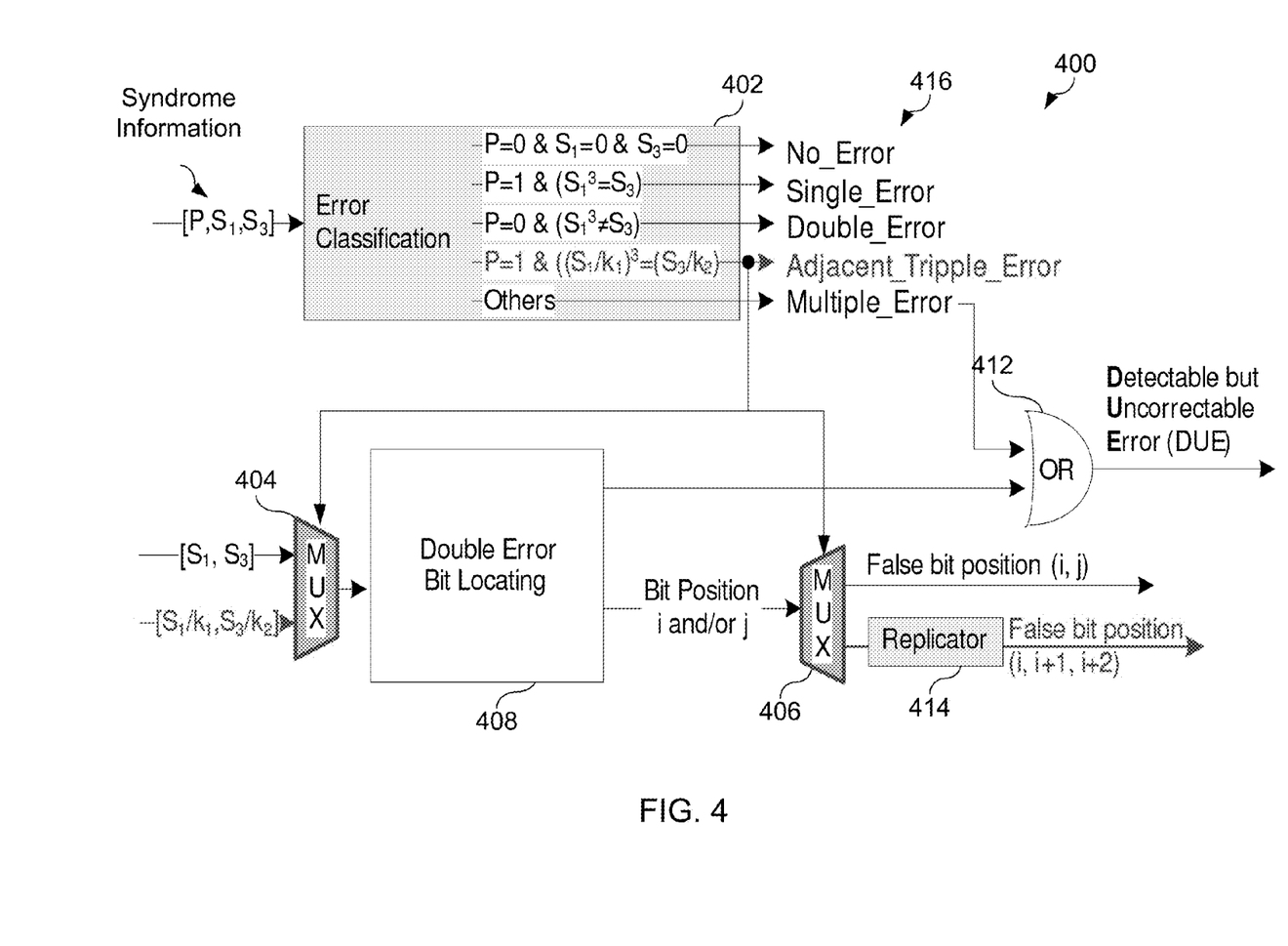
FIG. 4 is a block diagram associated with the error-correcting logic for DEC-TAEC in accordance with an embodiment.

FIG. 4 is a block diagram associated with the error-correcting logic for DEC-TAEC in accordance with an embodiment. Diagram 400 includes error-classification module 402, multiplexor 404, multiplexor 406, double error bit locating module 408, logic circuitry 412 and replicator module 414. Error-Classification module 402 receives parity information and syndrome information with which the Error-Classification module 402 produces an output describing the error classification associated with the syndrome. The possible error classification states may include: "No_Error," "Single_Error," "Double_Error," "Triple_Adjacent_Error" and "Multiple_Error" states. Error classification may pass an indication that the error type is a Triple_Adjacent_Error to double error bit locating module 408 to process a set of adjacent errors through the activation of multiplexor 404 and multiplexor 406. Includes error-classification module 402 may pass an indication that the error type is a multiple error to logic circuitry 412.

In the case of a Triple_Adjacent_Error an input is passed to multiplexors 404 and 406. Multiplexors 404 receive syndrome information associated with adjacent syndromes which is provided double error-Bit-Locating Logic 408, which produces an output describing whether or not an uncorrectable error is present and the first error bit position associated with the adjacent bits. Multiplexor 406 receives the bit position information and produces output.

In FIG. 4, the Triple_Adjacent_Error output, multiplexors, and replicator are additional logic modules dedicated to process adjacent errors. The remaining portions belong to the original DEC-TED logic discussed with reference to FIG. 3. The error classification logic adds an additional output—"Triple_Adjacent_Error", which will act as the select signal for MUXes in bit correcting block. The 'Double bit error locating Logic' calculates the coefficients for error locator polynomial: $S_1^3 x^2 + S_1^2 x + (S_1^3 + S_3)$. The polynomial is designed such that the roots are any single error bit syndrome. The logic then substitutes each H-column into the polynomial. The column(s) that can make the polynomial equal to zero (i.e. the root of the polynomial) indicates the error position. For adjacent errors, the transformed syndrome will replace the regular syndrome as inputs. The function block (Double Error-bit Locating) will work as usual to determine the position of the error, where in this case is only the starting bit. At the output side, the two bits following the located error bit will also be marked.

Figure 5:
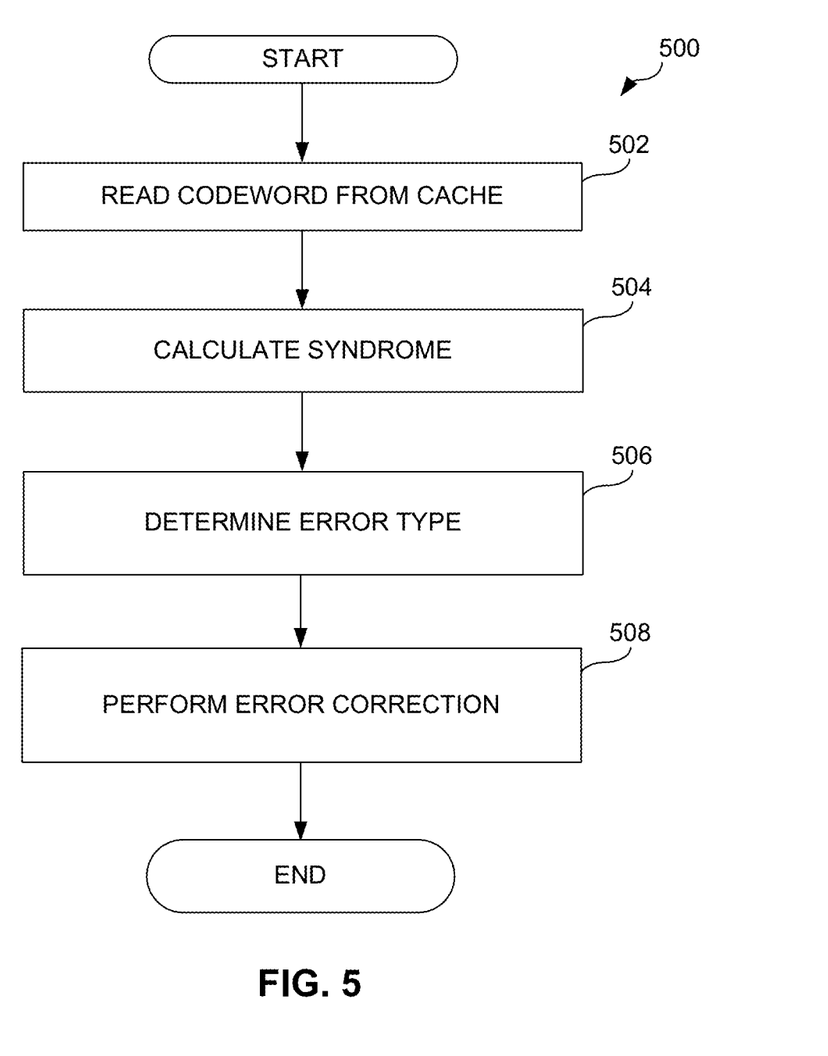
FIG. 5 is a logic flow diagram associated with processes and methods of embodiments of the present disclosure.

FIG. 5 is a logic flow diagram associated with processes and methods of embodiments of the present disclosure. Operations 500 begin with block 502 wherein an encoded codeword may be retrieved or read from cache. In block 504, a syndrome may be calculated using an H-matrix, the syndrome being that of the encoded codeword. In block 506, an error type of the syndrome may be determined. Then, in block 508, error correcting of the encoded codeword may be performed to produce corrected data wherein the error correcting is triggered by the error type of the syndrome. The error correcting is triggered when the syndrome comprises a detectable and correctable error. There may be cases where a detectable but uncorrectable error flag is produced when evaluating the syndrome against each column of the H-matrix does not determine an error bit position. In cases where double errors are detected and double-adjacent errors are corrected the process may continue by padding following bit as error.

In yet other embodiments error correcting may further comprise evaluating the syndrome and syndrome* against each column of the H-matrix to determine the first bit in triple-adjacent error bit positions. When first bit is located, the triple-adjacent error bit positions can be produced by padding the following two bits. Otherwise an uncorrectable error flag may be produced when the error bit positions are not adjacent.

Figure 6:
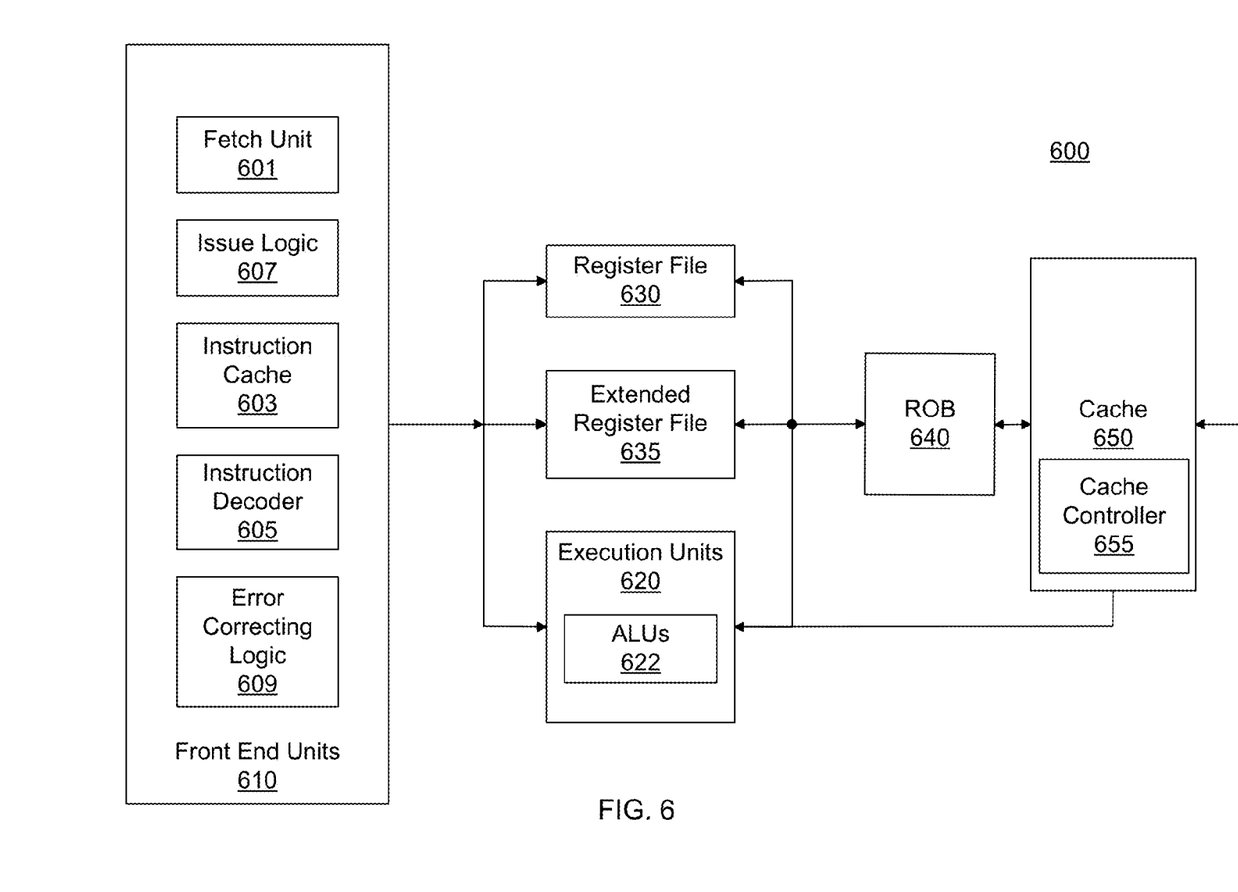
FIG. 6 is a block diagram of a processor core in accordance with one embodiment of the present invention.

Referring now to FIG. 6, shown is a block diagram of a processor core in accordance with one embodiment of the present invention. As shown in FIG. 6, processor core 600 may be a multi-stage pipelined out-of-order processor, and may operate at different voltages and frequencies (both in and out of turbo mode). As seen in FIG. 6, core 600 includes front end units 610, which may be used to fetch instructions to be executed and prepare them for use later in the processor. For example, front end units 610 may include a fetch unit 601, an instruction cache 603, an instruction decoder 605, issue logic 607 and error correcting logic 609. In some implementations, front end units 610 may further include a trace cache, along with microcode storage as well as a micro-operation storage. Fetch unit 601 may fetch macro-instructions, e.g., from memory or instruction cache 603, and feed them to instruction decoder 605 to decode them into primitives, i.e., micro-operations for execution by the processor. Decoding may involve error classification and correction executed by error correcting logic 609 as described with reference to FIGS. 1-5. In turn, issue logic 607 may schedule and issue instructions. Register file 630 may include separate register files for integer and floating point operations. Extended register file 635 may provide storage for vector-sized units, e.g., 256 or 512 bits per register.

Various resources may be present in execution units 620, including, for example, various integer, floating point, and single instruction multiple data (SIMD) logic units, among other specialized hardware. For example, such execution units may include one or more arithmetic logic units (ALUs) 622, among other such execution units.

Results from the execution units may be provided to retirement logic, namely a reorder buffer (ROB) 640. More specifically, ROB 640 may include various arrays and logic to receive information associated with instructions that are executed. This information is then examined by ROB 640 to determine whether the instructions can be validly retired and result data committed to the architectural state of the processor, or whether one or more exceptions occurred that prevent a proper retirement of the instructions. ROB 640 may handle other operations associated with retirement.

As shown in FIG. 6, ROB 640 is coupled to a cache 650 which, in one embodiment may be a low level cache (e.g., an L1 cache) although the scope of the present invention is not limited in this regard. Cache 650 may be a private cache that can be used as a speculative buffer as described herein. As further seen, cache 650 can include (or be associated with) a cache controller 655 which can perform conflict detection in accordance with an embodiment of the present invention. Also, execution units 620 can be directly coupled to cache 650. From cache 650, data communication may occur with higher level caches, system memory and so forth. While shown with this high level in the embodiment of FIG. 6, understand the scope of the present invention is not limited in this regard. For example, while the implementation of FIG. 6 is with regard to an out-of-order machine such as of a so-called x86 ISA, the scope of the present invention is not limited in this regard. That is, other embodiments may be implemented in an in-order processor, a reduced instruction set computing (RISC) processor such as an ARM-based processor, or a processor of another type of ISA that can emulate instructions and operations of a different ISA via an emulation engine and associated logic circuitry.

Figure 7:
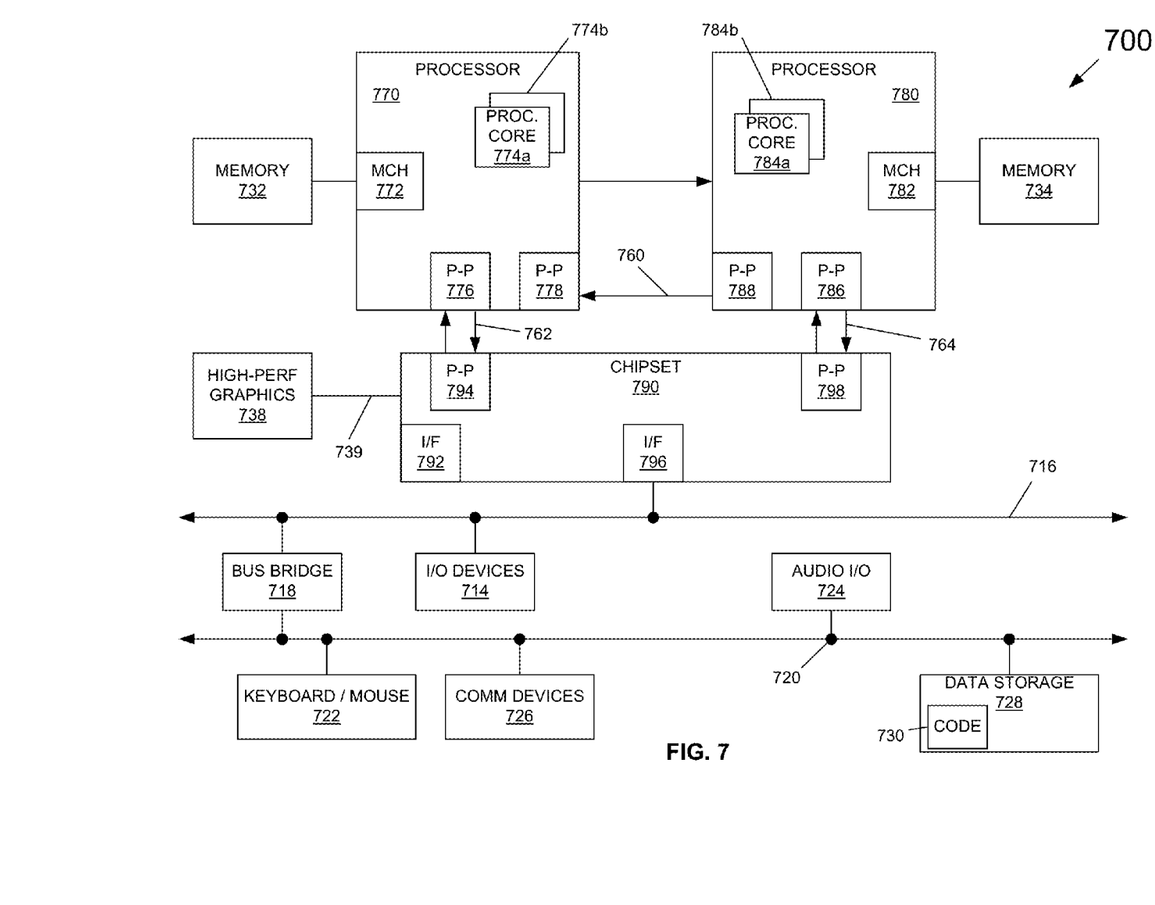
FIG. 7 is a block diagram of a system in accordance with an embodiment of the present invention.

Embodiments may be implemented in many different system types. Referring now to FIG. 7, shown is a block diagram of a system in accordance with an embodiment of the present invention. As shown in FIG. 7, multiprocessor system 700 is a point-to-point interconnect system, and includes a first processor 770 and a second processor 780 coupled via a point-to-point interconnect 750. As shown in FIG. 7, each of processors 770 and 780 may be multicore processors, including first and second processor cores (i.e., processor cores 774*a* and 774*b* and processor cores 784*a* and 784*b*), although potentially many more cores may be present in the processors. Each of the processors can include various hardware and/or logic to enable error correction, as described herein.

Still referring to FIG. 7, first processor 770 further includes a memory controller hub (MCH) 772 and point-to-point (P-P) interfaces 776 and 778. Similarly, second processor 780 includes a MCH 782 and P-P interfaces 786 and 788. As shown in FIG. 7, MCH's 772 and 782 couple the processors to respective memories, namely a memory 732 and a memory 734, which may be portions of system memory (e.g., DRAM) locally attached to the respective processors. First processor 770 and second processor 780 may be coupled to a chipset 790 via P-P interconnects 752 and 754, respectively. As shown in FIG. 7, chipset 790 includes P-P interfaces 794 and 798.

Furthermore, chipset 790 includes an interface 792 to couple chipset 790 with a high performance graphics engine 738, by a P-P interconnect 739. In turn, chipset 790 may be coupled to a first bus 716 via an interface 796. As shown in FIG. 7, various input/output (I/O) devices 714 may be coupled to first bus 716, along with a bus bridge 718 which couples first bus 716 to a second bus 720. Various devices may be coupled to second bus 720 including, for example, a keyboard/mouse 722, communication devices 726 and a data storage unit 728 such as a disk drive or other mass storage device which may include code 730, in one embodiment. Further, an audio I/O 724 may be coupled to second bus 720. Embodiments can be incorporated into other types of systems including mobile devices such as a smart cellular telephone, tablet computer, netbook, or so forth.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A processor comprising:
a cache to store data, the data encoded as a codeword;
a decoder to read the codeword from the cache, the decoder to calculate a syndrome of the codeword using an H-matrix, wherein calculation of the syndrome includes reordering columns of the H-matrix to produce a reordered H-matrix and use of the reordered H-matrix and the codeword in the calculation;
an error classification module to determine an error type of the syndrome; and
an error correction module, triggered by the error classification module, the error correction module to produce corrected data from the syndrome when the syndrome comprises a detectable and correctable error.

2. The processor of claim 1, wherein the error correction module comprises an error bit locating module to determine when adjacent errors exist that can be corrected as adjacent errors.

3. The processor of claim 2, wherein the error bit locating module is coupled to the error classification module with a pair of multiplexors coupled to an input and an output of the error bit locating module, the error bit locating module activated by an indication of a multiple bit error.

4. The processor of claim 2, wherein the error correction module is to produce a detectable but uncorrectable error (DUE) flag when a determination by the error classification module finds the syndrome to comprise a double error, multiple error, or when the error correction module does not determine an error bit position.

5. The processor of claim 1, wherein the error correction module comprises:
a bit correcting module to evaluate a normalized syndrome, determined from the syndrome, against each column of the H-matrix to determine a first error bit position;
an input multiplexor coupled to an input of the bit correcting module;
an output multiplexor coupled to an output of the bit correcting module, the input multiplexor and the output multiplexor triggered by a double error flag from the error classification module; and
the error bit correcting module to produce an uncorrectable error flag when the normalized syndrome evaluated against each column of the H-matrix does not determine the first error bit position.

6. The processor of claim 1, wherein the error correction module comprises:
error bit locating logic circuitry to evaluate a locator polynomial constructed based on a normalized syndrome, determined from the syndrome, against each column of the H-matrix to determine a first error bit position;
an input multiplexor coupled to an input of the error bit locating logic circuitry; and
an output multiplexor coupled to an output of the error bit locating logic circuitry, the input multiplexor and the output multiplexor triggered by a triple adjacent error flag from the error classification module;
wherein the error bit locating logic circuitry is to produce an uncorrectable error flag when the error bit locating logic circuitry does not determine the first error bit position.

7. The processor of claim 6, wherein the error correction module is to produce the uncorrectable error flag when the error classification module determines that the syndrome comprises a multiple error.

8. A system comprising:
a multi-core processor including:
- a cache to store data, the data encoded as a codeword to cache;
- a decoder to read the codeword from the cache, the decoder to determine a syndrome of the codeword using an H-matrix by reordering columns of the H-matrix and using the H-matrix with reordered columns and the codeword to calculate the syndrome;
- an error classification module to determine an error type of the syndrome;
- an error correction module, triggered by the error classification module, the error correction module to produce corrected data from the syndrome when the syndrome comprises a detectable and correctable error; and a dynamic random access memory (DRAM) coupled to the multi-core processor.

9. The system of claim 8, wherein the error correction module comprises a bit correcting module, the bit correcting module to evaluate the syndrome against each column of the H-matrix to determine a single error bit position.

10. The system of claim 9, wherein the error correction module is to produce a detectable but uncorrectable error (DUE) flag when evaluation of the syndrome against each column of the H-matrix does not determine the single error bit position.

11. The system of claim 9, wherein the error correction module is to produce a detectable but uncorrectable error (DUE) flag when the error classification module determines the syndrome comprises a double error, multiple errors, or when the error correction module evaluation of the syndrome against each column of the H-matrix does not determine the first error bit position.

12. The system of claim 8, wherein the error correction module comprises:
- a bit correcting module to evaluate a normalized syndrome that is determined from the syndrome, against each column of the H-matrix to determine a first error bit position;
- an input multiplexor coupled to an input of the bit correcting module;
- an output multiplexor coupled to an output of the bit correcting module, the input multiplexor and the output multiplexor triggered by a double error flag from the error classification module; and
- the bit correcting module to produce an uncorrectable error flag when the normalized syndrome evaluated against each column of the H-matrix does not determine the first error bit position.

13. The system of claim 8, wherein the error correction module comprises:
- a double error bit locating logic circuitry to evaluate a locator polynomial, based on the syndrome, against each column of the H-matrix to determine the first error bit position;
- an input multiplexor coupled to an input of the double error bit locating logic circuitry; and
- an output multiplexor coupled to an output of the double error bit locating logic circuitry, the input multiplexor and the output multiplexor triggered by a triple adjacent error flag from the error classification module;

wherein the error correction module is to:
- produce an uncorrectable error flag when double error bit locating logic circuitry cannot determine the first error bit position; and
- produce corrected data when the first error bit position is located.

14. The system of claim 13, wherein the error correction module is to produce a detectable but uncorrectable error (DUE) flag when the error classification module determines that the syndrome comprises a multiple error.

15. A method comprising:
- retrieving a codeword from a cache;
- calculating a syndrome of the codeword including reordering columns of an H-matrix to produce a reordered H-matrix and using the reordered H-matrix and the codeword to determine the syndrome;
- determining an error type of the syndrome; and
- error correcting the codeword to produce corrected data, the error correcting triggered by the error type of the syndrome, the error correcting triggered when the syndrome comprises a detectable and correctable error.

16. The method of claim 15, wherein the error correcting further comprises evaluating the syndrome against each column of the H-matrix.

17. The method of claim 16, further comprising producing a detectable but uncorrectable error (DUE) flag when evaluation of the syndrome against each column of the H-matrix does not determine an error bit position.

18. The method of claim 16, wherein the error correcting further comprises:
- producing a detectable but uncorrectable error (DUE) flag when the syndrome comprises a double error or multiple errors.

19. The method of claim 15, wherein the error correcting further comprises:
- evaluating the syndrome against each column of the H-matrix to determine a single error bit position;
- evaluating a normalized syndrome, determined from the syndrome, against each column of the H-matrix to determine a the first error bit position in an adjacent double-bit error pair; and
- producing the corrected data when the first error bit position is located and a second error bit position is adjacent to the first error bit position.

20. The method of claim 15, wherein the error correcting further comprises:
- evaluating a locator polynomial constructed based on the syndrome, against each column of the H-matrix to determine a triple adjacent error bit position;
- producing an uncorrectable error flag when a first error bit position cannot be determined; and
- producing corrected data when the first error bit position of the triple adjacent error is located and a second error bit position and a third error bit position are adjacent to the first error bit position.

* * * * *